(12) United States Patent
Ishimoto et al.

(10) Patent No.: US 10,765,048 B2
(45) Date of Patent: Sep. 1, 2020

(54) COMPONENT MOUNTING SYSTEM, COMPONENT SORTING METHOD, AND COMPONENT MOUNTER

(71) Applicant: Panasonic Intellectual Property Management Co., Ltd., Osaka (JP)

(72) Inventors: Kenichiro Ishimoto, Yamanashi (JP); Takuya Yamazaki, Fukuoka (JP); Tadashi Endo, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 335 days.

(21) Appl. No.: 15/643,723

(22) Filed: Jul. 7, 2017

(65) Prior Publication Data
US 2018/0077830 A1  Mar. 15, 2018

(30) Foreign Application Priority Data

Sep. 12, 2016 (JP) ................................. 2016-177340

(51) Int. Cl.
*H05K 13/04* (2006.01)
*H05K 13/08* (2006.01)
(52) U.S. Cl.
CPC ......... *H05K 13/04* (2013.01); *H05K 13/0857* (2018.08)
(58) Field of Classification Search
CPC ........................... H05K 13/04; H05K 13/0857
See application file for complete search history.

(56) References Cited

U.S. PATENT DOCUMENTS

| 8,528,198 | B2* | 9/2013 | Ishimoto | H05K 13/0061 29/833 |
| 8,595,920 | B2* | 12/2013 | Yamauchi | H05K 13/0452 29/729 |
| 2011/0179638 | A1* | 7/2011 | Nagao | B23K 1/0016 29/729 |
| 2012/0206732 | A1* | 8/2012 | Sumi | H05K 13/0061 356/500 |
| 2018/0077830 | A1* | 3/2018 | Ishimoto | H05K 13/0857 |

FOREIGN PATENT DOCUMENTS

JP 5278361 B 9/2013

* cited by examiner

*Primary Examiner* — Minh N Trinh
(74) *Attorney, Agent, or Firm* — Pearne & Gordon LLP

(57) ABSTRACT

A component mounting system includes at least one component mounter that is provided with a first board transport mechanism, a second board transport mechanism, a first mounting mechanism and a second mounting mechanism that mount components on a board, and a plurality of carriages that is respectively installed on the side of the first board transport mechanism and on the side of the second board transport mechanism and holds a plurality of tape feeders (component supply devices). When changing a production board type of a first board transported by the first board transport mechanism, the components are supplied from the component supply device held by a first carriage, a second carriage, and a third carriage, and the components are mounted on a second board that does not change the production board type by the first mounting mechanism and the second mounting mechanism.

5 Claims, 8 Drawing Sheets

FIG. 6A

Common degree of component P — 30

| | B001 | B002 | B003 | B004 | B005 | ... |
|---|---|---|---|---|---|---|
| B001 | | 82% | 79% | 25% | 33% | ... |
| B002 | | | 89% | 31% | 25% | ... |
| B003 | | | | 41% | 21% | ... |
| B004 | | | | | 85% | ... |
| B005 | | | | | | ... |
| ⋮ | | | | | | ... |

| Component group Gd | Production board type |
|---|---|
| Component group Gd1 | B001, B002, B003, B009, B010, B011, ..., BXX1, BXX2, ..., BXXX |
| Component group Gd2 | B004, B005, ..., BYYY |
| ⋮ | ⋮ |

FIG. 6C — 34

| Production board type | Production frequency F | Specific group Gp |
|---|---|---|
| B001 | 100 | Specific group Gp1 |
| B002 | 99 | Specific group Gp1 |
| B003 | 72 | Specific group Gp1 |
| B009 | 59 | Specific group Gp2 |
| B010 | 46 | Specific group Gp2 |
| B011 | 42 | Specific group Gp2 |
| BXX1 | 10 | Specific group Gp3 |
| BXX2 | 8 | Specific group Gp3 |
| ⋮ | ⋮ | Specific group Gp3 |
| BXXX | 1 | |

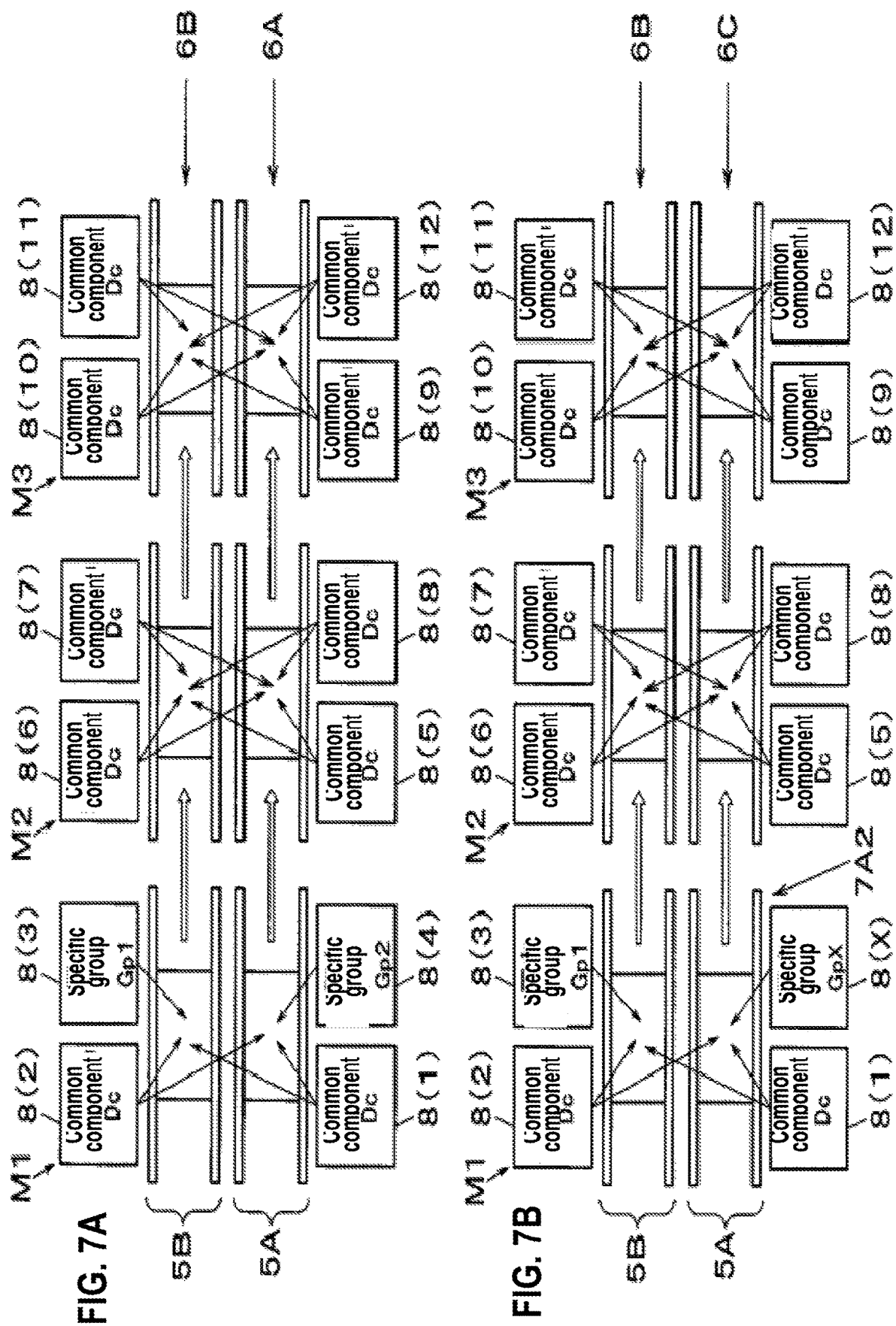

COMPONENT MOUNTING SYSTEM, COMPONENT SORTING METHOD, AND COMPONENT MOUNTER

BACKGROUND

1. Technical Field

The present invention relates to a component mounting system having a component mounter provided with a plurality of carriages that hold a component supply device supplying components, a component sorting method that sorts the components to the plurality of carriages, and a component mounter.

2. Description of the Related Art

A plurality of component feeders (component supply devices) such as a tape feeder are disposed in parallel for each component type in a component supplier of a component mounter that mounts a component on a board. In a case where a plurality of types of board types are to be produced, since the required component types are different depending on the board type, when changing the board type to be produced, feeder replacement operation involving replacement with the component feeder or addition of the component feeder of the component type depending on each board type is performed (for example, refer to PTL 1).

In PTL 1, it is described that the placement section in which the component feeder corresponding to the component type required for the current production is disposed, and the placement section in which the component feeder corresponding to the component type required for the next production is disposed are divided, and thus productivity is improved by excluding a decrease in the device operation rate due to device shutdown at the time of replacement of the feeder.

CITATION LIST

Patent Literature

PTL 1: Japanese Patent No. 5278361

SUMMARY

A component mounting system according to the disclosure includes at least one component mounter including a first board transport mechanism that transports, positions, and holds a board, a second board transport mechanism that transports, positions, and holds a board along the first board transport mechanism, a first mounting mechanism that is disposed on a side of the first board transport mechanism and mounts components on the board, a second mounting mechanism that is disposed on a side of the second board transport mechanism and mounts the components on the board, a plurality of carriages installed on the side of the first board transport mechanism and each hold a plurality of component supply devices which supply the components, and a plurality of carriages that are installed on the side of the second board transport mechanism and each hold the plurality of component supply devices. When changing a production board type of any one of the boards transported by the first board transport mechanism and the second board transport mechanism, the component mounting system supplies the components from the plurality of component supply devices held by a first carriage installed on the side of one of the board transport mechanisms that transports the board to be changed, and the plurality of component supply devices held by a second carriage and a third carriage installed on the side of another of the board transport mechanisms that transports the board not to be changed, and mounts the components on the board that does not change the production board type by the first mounting mechanism and the second mounting mechanism.

A component sorting method according to the disclosure for use in a component mounting system having at least one component mounter including a first board transport mechanism that transports, positions, and holds a board, a second board transport mechanism that transports, positions, and holds a board along the first board transport mechanism, a first mounting mechanism disposed on a side of the first board transport mechanism and mounts components on the board, a second mounting mechanism disposed on a side of the second board transport mechanism and mounts the components on the board, a plurality of carriages that are installed on the side of the first board transport mechanism and each hold a plurality of component supply devices which supplies the components, and a plurality of carriages that are installed on the side of the second board transport mechanism and each hold the plurality of component supply devices, acquires at least one piece of production information including component information of the components to be mounted on the board transported by the first board transport mechanism, and at least one piece of production information including component information of the components to be mounted on the board transported by the second board transport mechanism, prepares at least one component group, based on commonalities of the components included in an acquired plurality pieces of production information, sorts common components to be mounted on both of the board transported by the first board transport mechanism and the board transported by the second board transport mechanism among the prepared component groups, to a first carriage installed on the side of the first board transport mechanism and a second carriage installed on the side of the second board transport mechanism, sorts specific components to be mounted only on the board transported by the second board transport mechanism, to the other third carriage installed on the side of the second board transport mechanism, and sorts specific components to be mounted only on the board transported by the first board transport mechanism, to another fourth carriage installed on the side of the first board transport mechanism.

A component mounter according to the disclosure includes a first board transport mechanism that transports, positions, and holds a board, a second board transport mechanism that transports, positions, and holds a board along the first board transport mechanism, a first mounting mechanism disposed on a side of the first board transport mechanism and mounts components on the board, a second mounting mechanism disposed on a side of the second board transport mechanism and mounts the components on the board, a plurality of carriages that are installed on the side of the first board transport mechanism and each hold a plurality of component supply devices which supplies the component; and a plurality of carriages that are installed on the side of the second board transport mechanism and each hold the plurality of component supply devices. When changing a production board type of any one of the boards transported by the first board transport mechanism and the second board transport mechanism, the component mounter supplies the components from the plurality of component supply devices held by a first carriage installed on the side of one of the board transport mechanism that transports the board to be changed, and the plurality of component supply devices held by a second carriage and a third carriage installed on the side of another of the board transport mechanisms that transports the board not to be changed, and mounts the components on the board that does not change the production board type by the first mounting mechanism and the second mounting mechanism.

According to the disclosure, the decrease in the device operation rate due to device shutdown at the time of replacement of the feeder can be reduced, while suppressing the decrease in the number of placements of the component feeder.

BRIEF DESCRIPTION OF THE DRAWINGS

FIG. 6A is a diagram illustrating an example of a commonality of a component, FIG. 6B is a diagram illustrating an example of a component group, and FIG. 6C is a diagram illustrating an example of a specific group of a production board type produced in the component mounting system according to the exemplary embodiment of the invention;

FIGS. 7A and 7B are explanatory diagrams of the component mounting operation in the component mounting system according to the exemplary embodiment of the invention.

DETAILED DESCRIPTION

Before an exemplary embodiment of the disclosure is described, a problem in the related art is briefly described. In the related art including PTL 1, in addition to the section where the component feeder required for the current production is disposed in the component mounter, it is required to dispose a placement section for disposing the component feeder necessary for the next production, and there is a problem that the number of component feeders that can be disposed decreases accordingly.

Therefore, an object of the present disclosure is to provide a component mounting system, a component sorting method, and a component mounter which can reduce a decrease in the device operation rate due to device shutdown at the time of replacement of the feeder, while suppressing a decrease in the number of placements of the component feeder.

Figure 2:
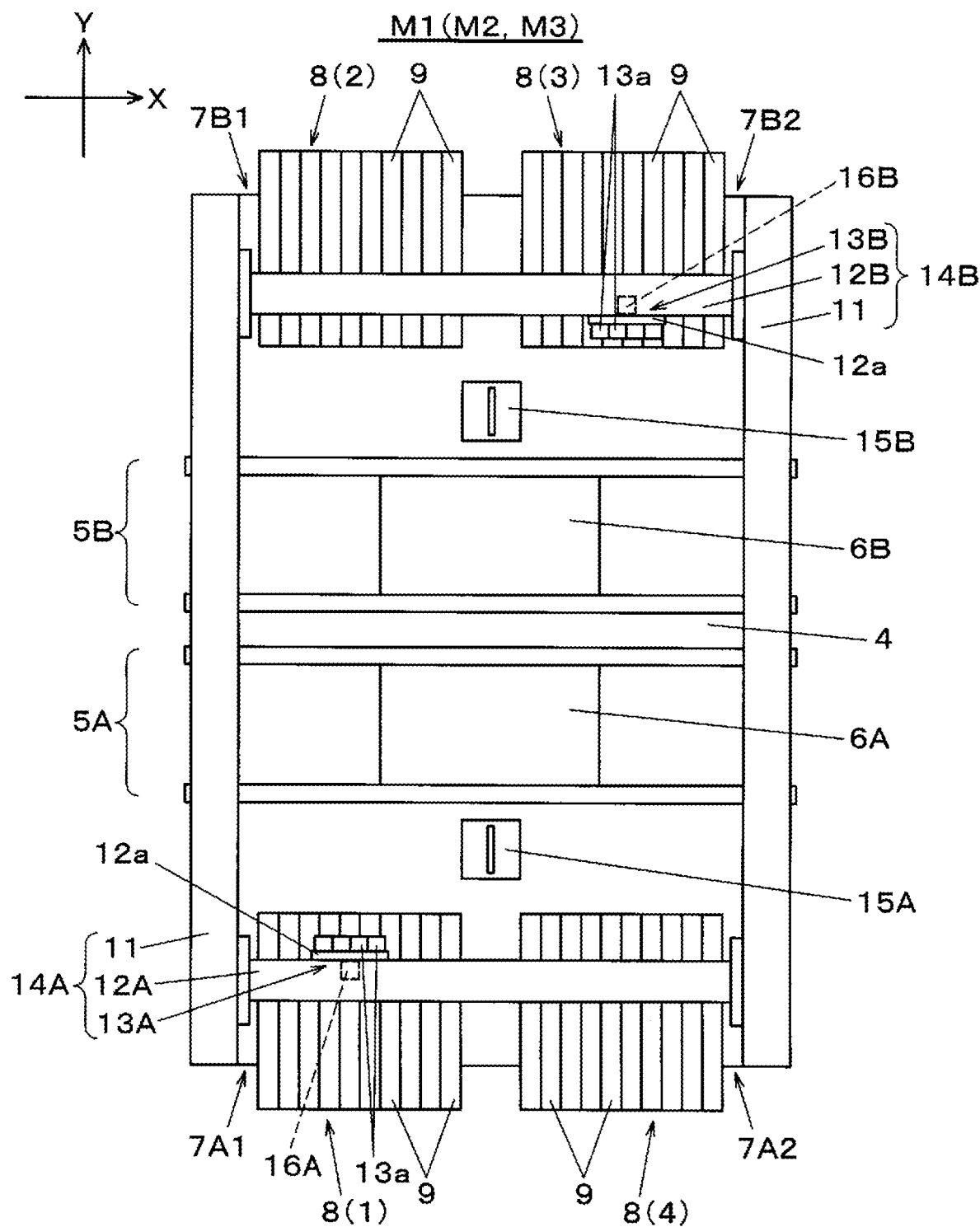
FIG. 2 is a plan view of a component mounter according to the exemplary embodiment of the invention.
Figure 3:
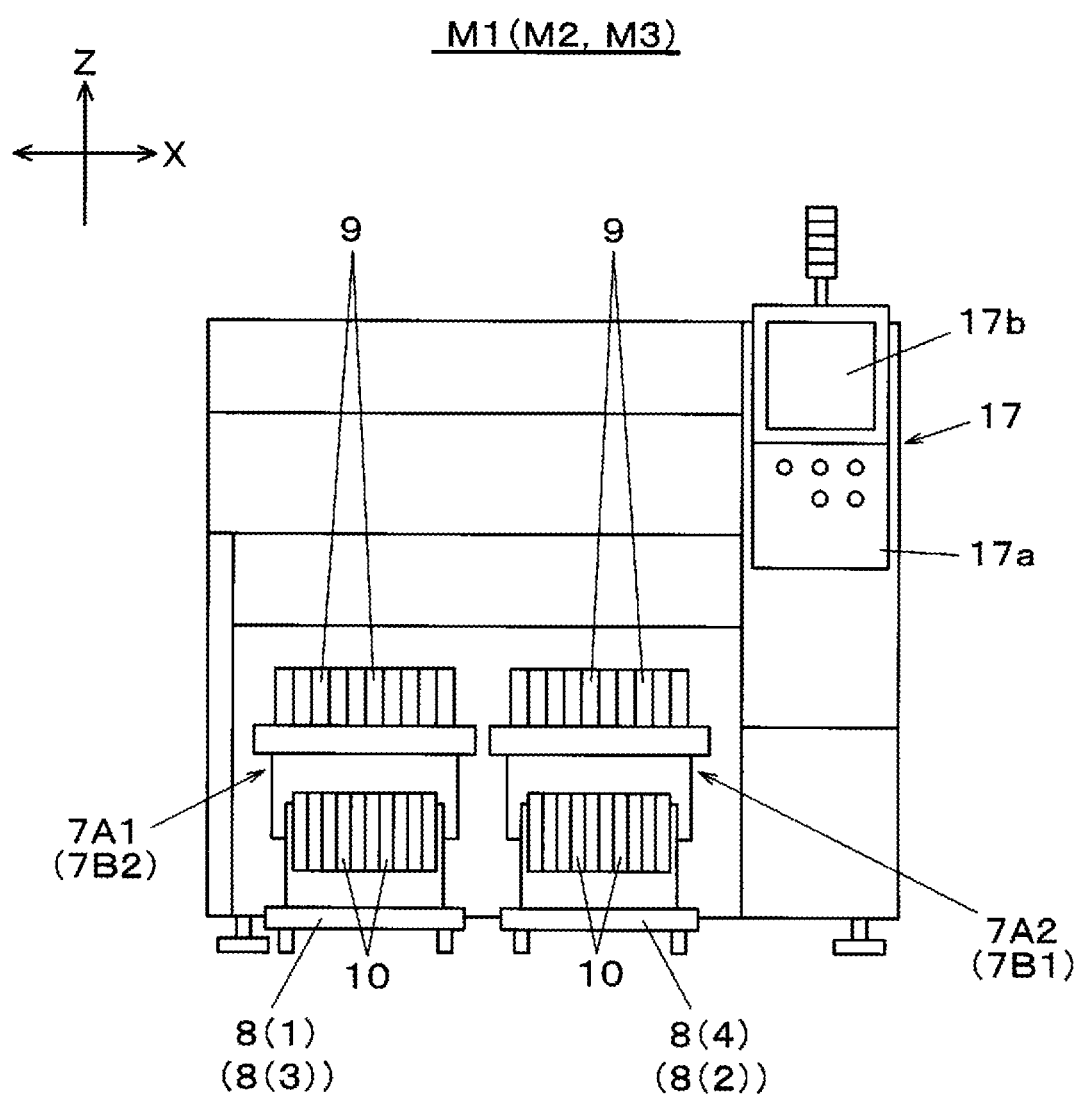
FIG. 3 is an explanatory configuration diagram of a carriage installation unit of the component mounter according to the exemplary embodiment of the invention.

An exemplary embodiment of the invention will be described in detail below with reference to the drawings. The configurations, forms, and the like described hereinafter will be examples to facilitate description, and may be modified, as appropriate, according to the specifications of a component mounting system and a component mounter. Hereinafter, elements corresponding to each other will be given the same symbols in all of the drawings, and duplicated description will be omitted. In FIG. 2 and some parts described later, an X direction (the left-right direction in FIG. 2) in a board transport direction and a Y direction (the up-down direction in FIG. 2) perpendicular to the board transport direction are illustrated as two axial directions which orthogonally intersect each other in a horizontal plane. In FIG. 3 and some parts described later, a Z direction (the up-down direction in FIG. 3) is illustrated as a height direction which is perpendicular to the horizontal plane. The Z direction is the up-down direction or a perpendicular direction in a case where the component mounter is installed on the horizontal plane.

Figure 1:
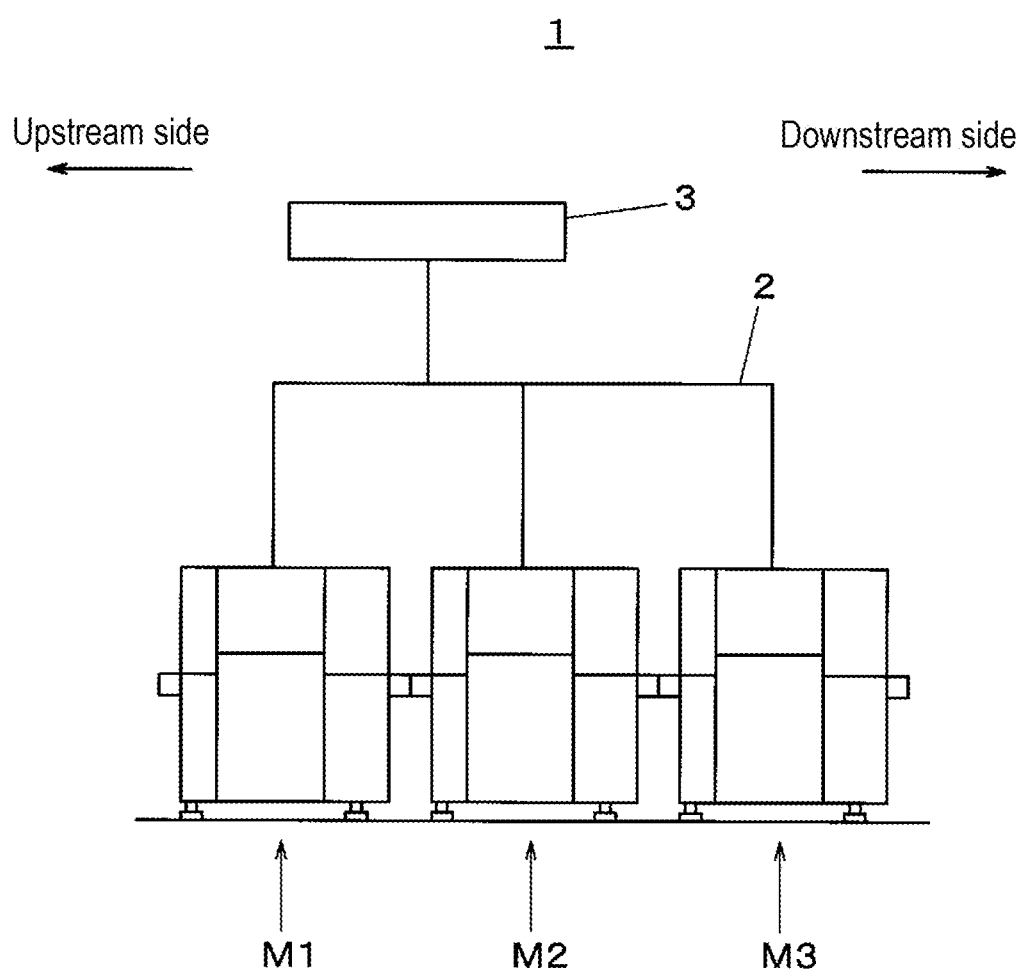
FIG. 1 is an explanatory configuration diagram of a component mounting system according to an exemplary embodiment of the invention.

First, component mounting system 1 will be described with reference to FIG. 1. In FIG. 1, component mounting system 1 is configured to connect component mounter M1, component mounter M2, and component mounter M3 in the board transport direction (direction from an upstream side toward a downstream side), and to be connected by communication network 2, and entire system is configured to be controlled by management computer 3. Component mounting system 1 has a function that mounts a component on a board to produce a mounted board.

Next, the configuration of component mounters M1 to M3 will be described with reference to FIGS. 2 and 3. Component mounters M1 to M3 have the same configuration, and component mounter M1 will be described here. In FIG. 2, first board transport mechanism 5A, and second board transport mechanism 5B extending in the X direction are disposed on a central portion of base 4 in parallel in the Y direction. First board transport mechanism 5A and second board transport mechanism 5B transfer first board 6A and second board 6B respectively transported from the upstream side, to a mounting working position, position, and hold first board 6A and second board 6B.

That is, component mounter M1 is provided with first board transport mechanism 5A that transports, positions, and holds first board 6A, and second board transport mechanism 5B that transports, positions, and holds second board 6B along first board transport mechanism 5A. Hereinafter for convenience, unless it is required to identify, first board transport mechanism 5A and second board transport mechanism 5B are simply referred to as "board transport mechanism 5". In addition, first board 6A and second board 6B are simply referred to as "board 6".

In FIG. 2, on a front side of first board transport mechanism 5A, first carriage installation unit 7A1 is disposed on the upstream side, and fourth carriage installation unit 7A2 is disposed on the downstream side. On a rear side of second board transport mechanism 5B, second carriage installation unit 7B1 is disposed on the upstream side, and third carriage installation unit 7B2 is disposed on the downstream side. First carriage 8(1) is installed on first carriage installation unit 7A1, second carriage 8(2) is installed on second carriage installation unit 7B1, third carriage 8(3) is installed on third carriage installation unit 7B2, and fourth carriage 8(4) is installed on fourth carriage installation unit 7A2 so as to be respectively detachable therefrom.

Hereinafter for convenience, unless it is required to identify, first carriage installation unit 7A1, fourth carriage installation unit 7A2, second carriage installation unit 7B1, and third carriage installation unit 7B2 are simply referred to as "carriage installation unit 7". In addition, first carriage 8(1), second carriage 8(2), third carriage 8(3), and fourth carriage 8(4) are simply referred to as "carriage 8".

On carriage 8, a plurality of tape feeders 9 are installed in parallel, and component reels 10 that winds and stores carrier tapes accommodating the components are held in parallel (refer to FIG. 3). A carrier tape pulled out from component reel 10 in the direction from the outside of component mounter M1 to board transport mechanism 5 (tape feeding direction) is pitch-fed. In this manner, tape feeder 9 is a component supply device that supplies a component to a component pick up position by a mounting head (described later). Carriage 8 on which tape feeder 9 (component supply device) is installed and installed on carriage installation unit 7, forms a component supplier that supplies the components to the component pick up position.

When carriage 8 is installed on carriage installation unit 7, carriage 8 and tape feeder 9 on which carriage 8 is installed are electrically connected to controller 20 (refer to FIG. 4) of component mounter M1. An electrically identifiable carriage ID is previously assigned to each carriage 8, and when carriage 8 is installed on carriage installation unit 7, the carriage ID of installed carriage 8 is identified by carriage installation determination unit 20b (refer to FIG. 4) provided in controller 20. In this manner, installation of carriage 8 on component mounter M1 is detected, and installed carriage 8 (carriage ID) is identified.

The number of carriages 8 installed on the front side of first board transport mechanism 5A or the rear side of second board transport mechanism 5B is not respectively limited to two, and may be three or more. That is, component mounter M1 is provided with the plurality of carriages 8 that are installed on the side of first board transport mechanism 5A, and hold the plurality of tape feeder 9 (component supply device) supplying the components, and the plurality of carriages 8 that are installed on the side of second board transport mechanism 5B, and hold the plurality of tape feeder 9 (component supply device).

In FIG. 2, Y-axis beams 11 having a linear drive mechanism are respectively arranged at both ends in the X direction on the upper surface of base 4. First X-axis beam 12A and second X-axis beam 12B similarly provided with the linear drive mechanisms are respectively joined to move freely in the Y direction between two Y-axis beams 11. First mounting head 13A is installed on first X-axis beam 12A to move freely in the X direction. Second mounting head 13B is installed on second X-axis beam 12B to move freely in the X direction. First mounting head 13A and second mounting head 13B are provided with a plurality of suction units 13a on which suction nozzles for sucking and holding the components are installed at each of the lower end of the head.

Y-axis beam 11 and first X-axis beam 12A move first mounting head 13A in the X direction and the Y direction. Y-axis beam 11, first X-axis beam 12A, and first mounting head 13A form first mounting mechanism 14A that picks up the components using suction nozzle from the component pick up position of first carriage 8(1) installed on first carriage installation unit 7A1 and fourth carriage installation unit 7A2 and tape feeder 9 held by fourth carriage 8(4), transfers to, and mounts on the mounting point of board 6 positioned and held by board transport mechanism 5. That is, component mounter M1 is provided with first mounting mechanism 14A that is disposed on the side of first board transport mechanism 5A, and mounts the components on board 6.

Y-axis beam 11 and second X-axis beam 12B move second mounting head 13B in the X direction and the Y direction. Y-axis beam 11, second X-axis beam 12B, and second mounting head 13B form second mounting mechanism 14B that picks up the components using suction nozzle from the component pick up position of second carriage 8(2) installed on second carriage installation unit 7B1 and third carriage installation unit 7B2 and tape feeder 9 held by third carriage 8(3), transfers to, and mounts on the mounting point of board 6 positioned and held by board transport mechanism 5. That is, component mounter M1 is provided with second mounting mechanism 14B that is disposed on the side of second board transport mechanism 5B, and mounts the components on board 6.

In this manner, first mounting mechanism 14A and second mounting mechanism 14B can mount the components on both first board 6A and second board 6B positioned and held by board transport mechanism 5. Hereinafter for convenience, unless it is required to identify, first X-axis beam 12A and second X-axis beam 12B are simply referred to as "X-axis beam 12", first mounting head 13A and second mounting head 13B are simply referred to as "mounting head 13".

In FIG. 2, component recognition cameras 15A and 15B are arranged between carriage installation unit 7 and board transport mechanism 5. When mounting head 13 that picks up the components from carriage 8(component supplier) installed on carriage installation unit 7 moves upward, component recognition cameras 15A and 15B image and recognize the components held by the suction nozzle of mounting head 13.

Board recognition cameras 16A and 16B positioned on the lower side of X-axis beam 12 and integrally moving with mounting head 13, are installed on plate 12a to which mounting head 13 is attached. Board recognition cameras 16A and 16B integrally move with mounting head 13, and thus board recognition cameras 16A and 16B move above board 6 positioned and held by board transport mechanism 5, image to recognize a board mark (not illustrated) disposed on board 6. In a component mounting operation to board 6 carried out by mounting head 13, mounting position correction is performed, taking into account the recognition results of the component by component recognition cameras 15A and 15B and the board recognition results by board recognition cameras 16A and 16B.

FIG. 3 illustrates carriage installation unit 7 and a device operation surface in component mounter M1. Carriage 8 having a plurality of tape feeders 9 on which carrier tapes drawn out from component reel 10 are installed is installed on carriage installation unit 7. Operation unit 17 provided with input unit 17a and display unit 17b is disposed on the device operation surface. Operation buttons for performing various operation inputs are placed on input unit 17a. Display unit 17b is a display device such as a liquid crystal panel, and various screens such as a guide screen for performing an operation input by input unit 17a are displayed.

Next, a configuration of control system of component mounting system 1 will be described with reference to FIG. 4. Component mounters M1 to M3 have the same configuration, and component mounter M1 will be described here. Component mounter M1 includes controller 20, storage unit 21, first board transport mechanism 5A, second board transport mechanism 5B, first mounting mechanism 14A, second mounting mechanism 14B, first carriage installation unit 7A1, second carriage installation unit 7B1, third carriage installation unit 7B2, fourth carriage installation unit 7A2, component recognition camera 15A and 15B, board recognition camera 16A and 16B, input unit 17a, display unit 17b, and communication unit 23. Communication unit 23 is a communication interface and exchanges signals and data with management computer 3 and the other component mounters M2 and M3 via communication network 2.

Controller 20 is an arithmetic processing device having a CPU function, and is provided with mounting controller 20a and carriage installation determination unit 20b as internal processing functions. Storage unit 21 is a storage device, and stores mounting data 21a and carriage information data 21b. First carriage 8(1) is installed on first carriage installation unit 7A1, second carriage 8(2) is installed on second carriage installation unit 7B1, third carriage 8(3) is installed on third carriage installation unit 7B2, and fourth carriage 8(4) is installed on fourth carriage installation unit 7A2 so as to respectively hold the plurality of tape feeders 9.

Mounting data 21a is data such as the component type of the components to be mounted and the mounting position in board 6, and is stored for each production board type to be produced. Carriage information data 21b includes information on carriages 8(1) to 8(4) installed on component mounter M1 associated with the carriage ID, and on the components supplied from tape feeder 9 held by carriage 8 for replacement used in the next production. Carriage installation determination unit 20b detects the mounting of carriage 8 to carriage installation unit 7 and identifies the detected carriage ID of carriage 8.

Mounting controller 20a performs a component mounting working by controlling first board transport mechanism 5A, second board transport mechanism 5B, first mounting mechanism 14A, second mounting mechanism 14B, tape feeder 9 (component supplier) held by carriages 8(1) to 8(4), component recognition cameras 15A and 15B, and board recognition cameras 16A and 16B, based on mounting data 21a, carriage information data 21b, and the carriage ID identified by carriage installation determination unit 20b.

More specifically, depending on the components supplied from tape feeder 9 held by installed carriages 8(1) to 8(4), mounting controller 20a determines whether or not both first board 6A transported by first board transport mechanism 5A and second board 6B transported by second board transport mechanism 5B can be produced. When it is determined that both boards can be produced, mounting controller 20a mounts the components on first board 6A and second board 6B by first mounting mechanism 14A and second mounting mechanism 14B.

When any one of carriages 8(1) to 8(4) is removed for reasons such as a change in the production board type, depending on the components supplied from tape feeder 9 held by remaining carriage 8, mounting controller 20a determines whether or not one of first board 6A and second board 6B can be produced. When it is determined that any of board 6 can be produced, mounting controller 20a continues to mount the components on board 6 that can be produced by first mounting mechanism 14A and second mounting mechanism 14B, without stopping component mounter M1.

Here, an example of a component mounting working in component mounter M1 will be described with reference to FIGS. 5A to 5B. Tape feeder 9 that supplies the components to be mounted on first board 6A, second board 6B, and third board 6C is held on first carriage 8(1) and second carriage 8(2). Tape feeder 9 that supplies the components to be mounted on second board 6B is held on third carriage 8(3), tape feeder 9 that supplies the components to be mounted on first board 6A is held on fourth carriage 8(4), and tape feeder 9 that supplies the components to be mounted on third board 6C is held on carriage 8(Z) for replacement, respectively.

Figure 5A:
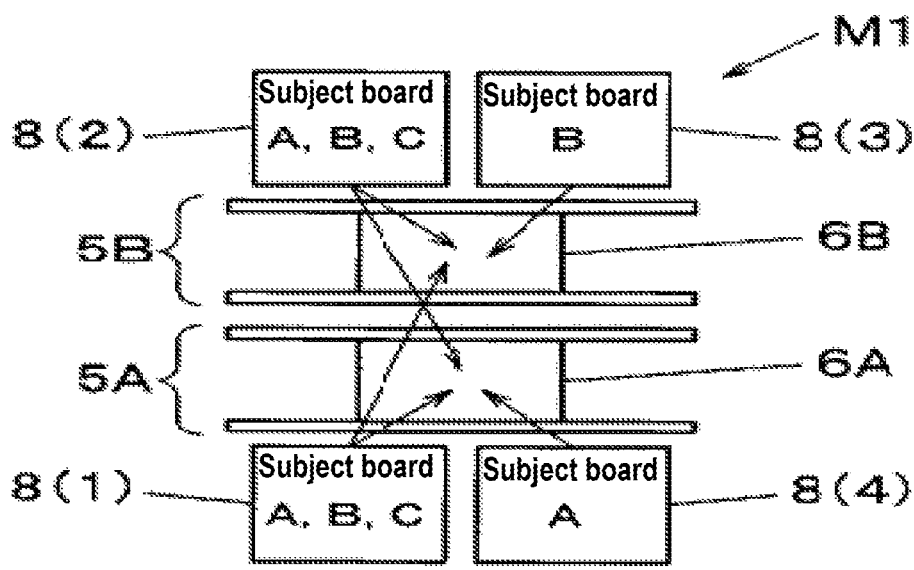
FIGS. 5A, 5B, and 5C are explanatory diagrams of component mounting operations in the component mounter according to the exemplary embodiment of the invention.

In FIG. 5A, carriages 8(1) to 8(4) are installed on component mounter M1. Therefore, mounting controller 20a determines that both first board 6A and second board 6B can be produced. Accordingly, mounting controller 20a causes first board transport mechanism 5A to transport first board 6A, and second board transport mechanism 5B to transport second board 6B. Mounting controller 20a causes tape feeder 9 held by first carriage 8(1) and fourth carriage 8(4) to supply the components, and causes first mounting mechanism 14A to mount the components on first board 6A and second board 6B. In addition, mounting controller 20a causes tape feeder 9 held by second carriage 8(2) and third carriage 8(3) to supply the components, and causes second mounting mechanism 14B to mount the components on first board 6A and second board 6B.

Figure 5B:
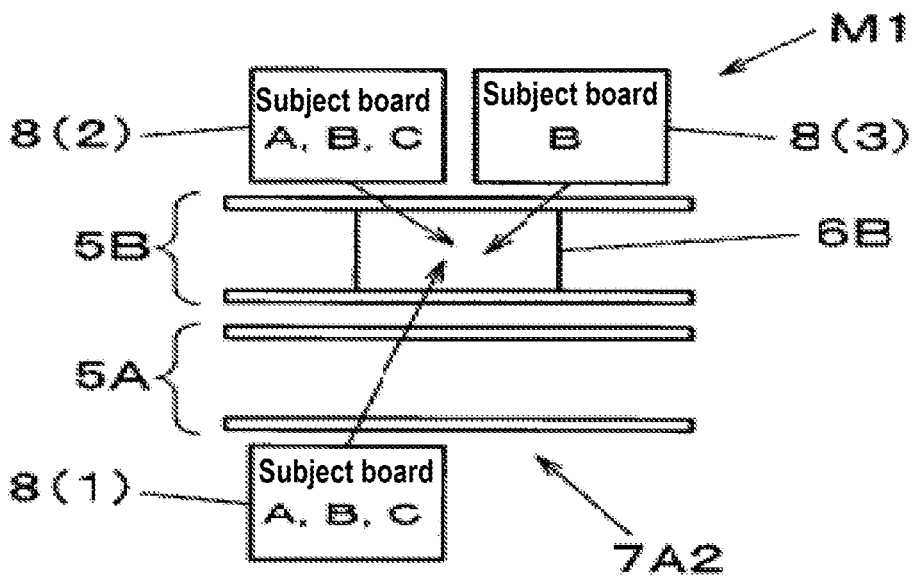

In FIG. 5B, fourth carriage 8(4) is pulled out from fourth carriage installation unit 7A2 in order to change the board type to be transported by first board transport mechanism 5A. Therefore, mounting controller 20a determines that only second board 6B can be produced. Therefore, mounting controller 20a causes second board transport mechanism 5B to transport second board 6B, without causing first board transport mechanism 5A to transport board 6. Mounting controller 20a causes tape feeder 9 held by first carriage 8(1) to supply the components, and causes first mounting mechanism 14A to mount the components on second board 6B. In addition, mounting controller 20a causes tape feeder 9 held by second carriage 8(2) and third carriage 8(3) to supply the components, and causes second mounting mechanism 14B to mount the components on second board 6B.

Figure 5C:
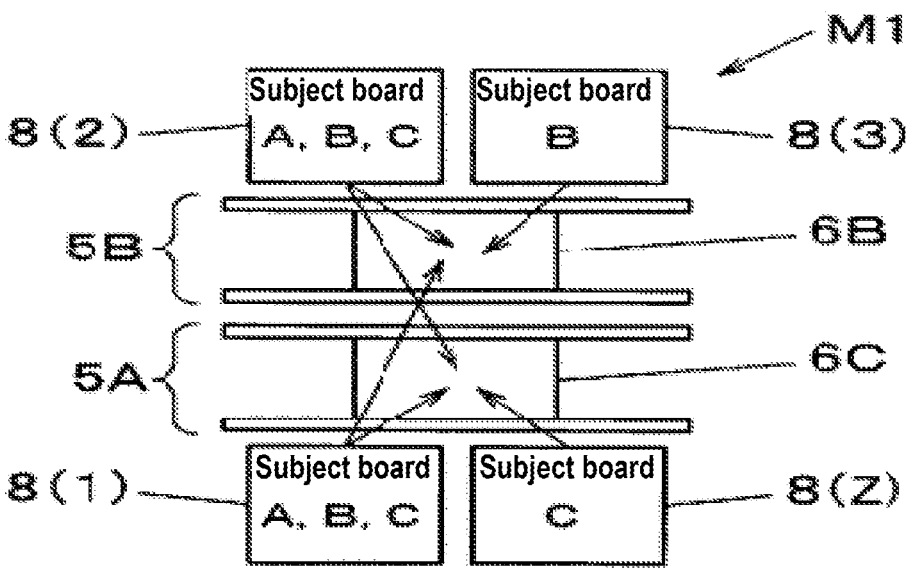

In FIG. 5C, carriage 8(Z) for replacement is installed on fourth carriage installation unit 7A2. Therefore, mounting controller 20a determines that second board 6B and third board 6C can be produced. Accordingly, mounting controller 20a causes first board transport mechanism 5A to transport third board 6C, and second board transport mechanism 5B to transport second board 6B. Mounting controller 20a causes tape feeder 9 held by first carriage 8(1) and carriage 8(Z) for replacement to supply the components, and causes first mounting mechanism 14A to mount the components on third board 6C and second board 6B. In addition, mounting controller 20a causes tape feeder 9 held by second carriage 8(2) and third carriage 8(3) to supply the components, and causes second mounting mechanism 14B to mount the components on third board 6C and second board 6B.

In this manner, when changing the production board type of any one of boards 6 transported by first board transport mechanism 5A or second board transport mechanism 5B (for example, FIG. 5B), component mounter M1 supplies the components from tape feeder 9 (component supply device) held by first carriage 8(1) installed on the side of board transport mechanism 5 (first board transport mechanism 5A) that transports board 6 (first board 6A) to be changed, and tape feeder 9 (component supply device) held by second carriage 8(2) and third carriage 8(3) installed on the side of board transport mechanism 5 (second board transport mechanism 5B) that transports board 6 (second board 6B) not to be changed, and causes first mounting mechanism 14A and second mounting mechanism 14B to mount the components on board 6 (second board 6B) which does not change the production board type.

In this manner, component mounter M1 can reduce a decrease in the device operation rate due to device shutdown at the time of replacement of the feeder, while suppressing a decrease in the number of placements of tape feeder 9 (component feeder, component supply device).

In addition, when changing the production board type of any one of boards 6 transported by first board transport mechanism 5A or second board transport mechanism 5B (for example, FIG. 5B), while exchanging fourth carriage 8(4) installed on the side of board transport mechanism 5 (first board transport mechanism 5A) that transports board 6 (first board 6A) to be changed, component mounter M1 continues to mount the components on board 6 (second board 6B) which does not change the production board type. In this manner, the decrease in the device operation rate due to device shutdown at the time of replacement of the feeder can be reduced.

Figure 4:
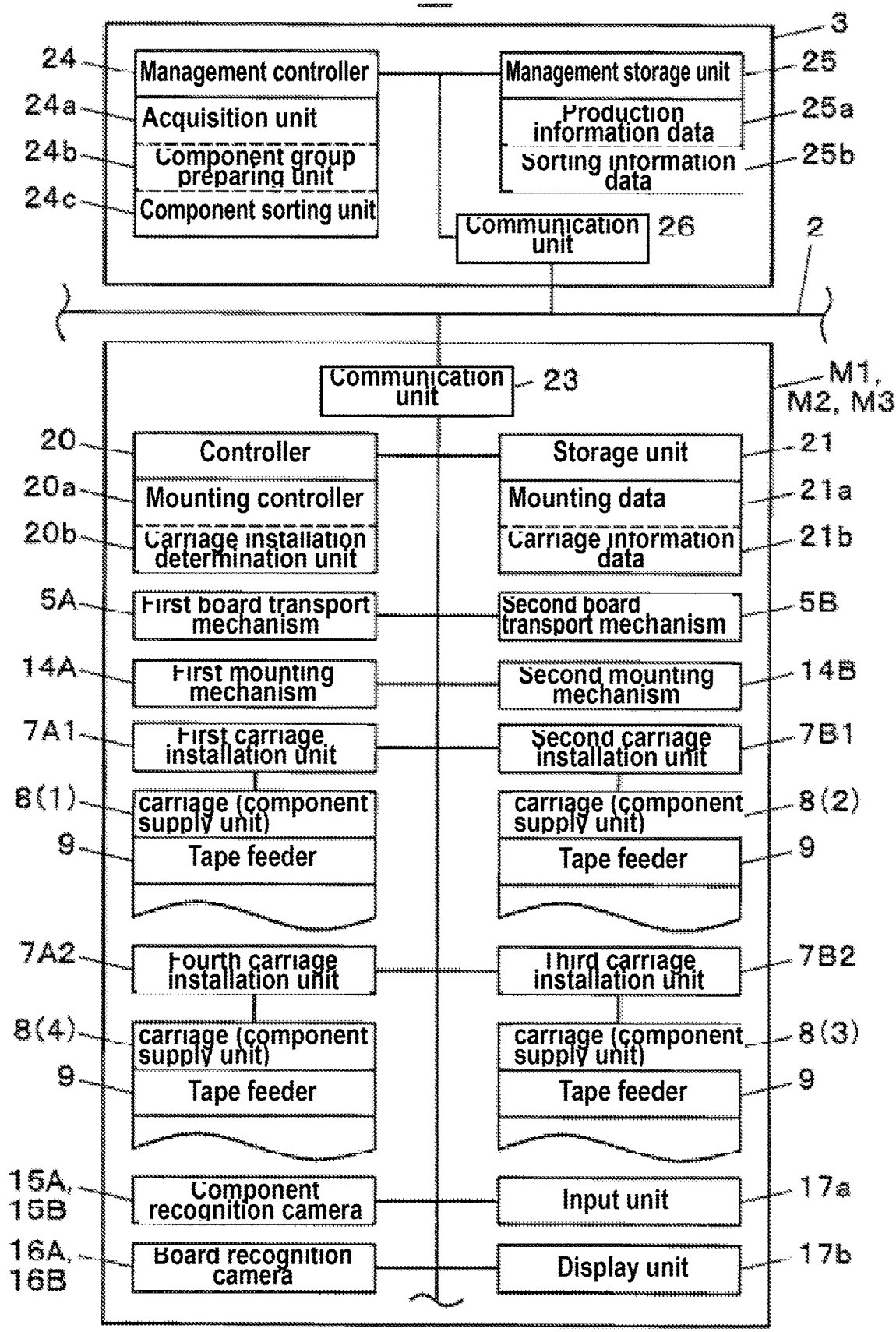
FIG. 4 is a block diagram illustrating a configuration of a control system of the component mounting system according to the exemplary embodiment of the invention.

In FIG. 4, management computer 3 is provided with management controller 24, management storage unit 25, and communication unit 26. Communication unit 26 is a communication interface and exchanges signals and data between communication unit 26 and component mounters M1 to M3 via communication network 2. Management controller 24 is an arithmetic processing device having a CPU function, and is provided with acquisition unit 24a, component group preparing unit 24b, and component sorting unit 24c as internal processing functions. Management storage unit 25 is a storage device, and stores production information data 25a and sorting information data 25b. Production information I including component information such as component type and mounting position of the components to be mounted on board 6, is stored for each production board type in production information data 25a.

Acquisition unit 24a, component group preparing unit 24b, and component sorting unit 24c sequentially perform data processing, based on production information I stored in production information data 25a, and perform component sorting process that generates sorting information data 25b which sorts the component type to be supplied by tape feeder 9 held by each carriage 8. Acquisition unit 24a extracts production information I including the component information of board 6 (production board type) to be produced, which is transported to board transport mechanism 5, from production information data 25a, and obtains extracted production information I. That is, acquisition unit 24a acquires at least one piece of production information I including the component information of the components to be mounted on board 6 (first board 6A) transported by first board transport mechanism 5A, and production information I including the component information of the components to be mounted on board 6 (second board 6B) transported by second board transport mechanism 5B.

Component group preparing unit 24b compares the component types included in production information I of each production board type acquired by acquisition unit 24a, calculates commonality P of the component between the production board types, and prepares component group Gd configured with the components to be mounted on the production board type having high commonality P of the component. That is, component group preparing unit 24b prepares at least one component group Gd, based on commonality P of the component included in the acquired plurality pieces of production information I.

Here, an example of commonality P of the component will be described with reference to FIG. 6A. Table 30 in FIG. 6A illustrates an example of commonality P of the component between production board types B001, B002, and the like. In Table 30, commonality P of the component between the two production board types is displayed in the columns where the production board types B001, B002, and the like displayed in a matrix form in row 31 and column 32, intersect each other. In this example, the number of components common to the total number of types of the components mounted on the two production board types is indicated by percentage % as commonality P of the component.

In the example of Table 30, commonality P of the component of production board type B001 and production board type B002 is as relatively high as 82%, and commonality P of the component of production board type B001 and production board type B004 is as relatively low as 25%. Commonality P of the component is not limited to the above, and may be any index as long as commonality P quantitatively indicates the correlation between the components mounted on the two production board types.

Next, an example of component group Gd will be described with reference to FIG. 6B. Table 33 in FIG. 6B illustrates an example of component group Gd prepared, based on commonality P of the component illustrated in Table 30. In the example, as component group Gd1, the components to be mounted on the production board types B001, B002, B003, B009, B010, B011, . . . , BXX1, BXX2, . . . , and BXXX having relatively high commonality P of the component is selected. In addition, as component group Gd2, the components to be mounted on the production board types B004, B005, . . . , and BYY having relatively high commonality P of the component is selected.

In FIG. 4, component sorting unit 24c classifies the components to be included in component group Gd to be prepared by component group preparing unit 24b, into common component Dc and specific component Dp. Common component Dc is the component to be supplied to all production board types of component group Gd, and is not replaced after being set in component mounters M1 to M3. Specific component Dp is the component to be supplied only to a specific production board type of component group Gd, and is replaced and set in component mounters M1 to M3 according to a production plan.

Component sorting unit 24c sorts common component Dc to each carriage 8 in a state where each carriage 8 is installed on carriage installation unit 7 so as to be supplied to both first board 6A transported by first board transport mechanism 5A, and second board 6B transported by second board transport mechanism 5B. In addition, component sorting unit 24c prepares specific group Gp in which specific components Dp are sorted to the plurality of carriages 8, based on production frequency F at which the production board type is produced. For example, component sorting unit 24c prepares specific group Gp so that specific components Dp supplied to the production board type having high production frequency F are set on the same carriage 8.

That is, component sorting unit 24c sorts common component Dc mounted on both board 6 (first board 6A) transported by first board transport mechanism 5A and board 6 (second board 6B) transported by second board transport mechanism 5B, to first carriage 8(1) and second carriage 8(2) among prepared component groups Gd. Component sorting unit 24c sorts specific component Dp mounted only on board 6 (second board 6B) transported by board transport mechanism 5 (second board transport mechanism 5B) on the side where second carriage 8(2) is installed, to third carriage 8(3). In addition, component sorting unit 24c sorts specific component Dp mounted only on board 6 (first board 6A) transported by board transport mechanism 5 (first board transport mechanism 5A) on the side where first carriage 8(1) is installed, to the other fourth carriage 8(4) on the side where first carriage 8(1) is installed.

In this manner, information on which the components are sorted to each carriage 8 is stored in management storage unit 25 as sorting information data 25b. Sorting information data 25b is transmitted to component mounters M1 to M3 where carriage 8 is installed, and stored in storage unit 21 as carriage information data 21b. In addition, sorting information data 25b is used as information to be referred to by so-called external setup in which the operator installs tape feeder 9 and component reel 10 are mounted on carriage 8 for replacement picked up from component mounters M1 to M3.

Here, an example in which specific component Dp of component group Gd are sorted to the plurality of specific groups Gp will be described with reference to FIG. 6C. In Table 34 of FIG. 6C, specific components Dp of component group Gd1 illustrated in Table 33 are sorted to three specific groups Gp1, Gp2, and GpX. In Table 34, in descending order of production frequency F, production board types B001, B002, and B003 are sorted to specific group Gp1, production board types B009, B010, and B011 are sorted to specific group Gp2, and production board types BXX1, BXX2, . . . , and BXXX are sorted to specific group GpX. In this example, as production frequency F, a ratio is used that sets the number of production board types B001 to be produced in a predetermined period as 100. Production frequency F is not limited thereto, and may be any value as long as the magnitude of the frequency at which each production board type is produced, is relatively represented.

Next, an example of the components mounting workings in component mounters M1 to M3 of component mounting system 1 in which the component is set, based on sorting information data 25b will be described with reference to FIGS. 7A and 7B. The production board types illustrated in FIGS. 6A to 6C are set to be sorted on sorting information data 25b. In FIG. 7A, first carriage 8(1) installed on the side of first board transport mechanism 5A of component mounter M1, second carriage 8(2) installed on the side of second board transport mechanism 5B of component mounter M1, carriages 8(5) to 8(8) installed on component mounter M2, and carriages 8(9) to 8(12) installed on component mounter M3 hold tape feeder 9 for supplying common component Dc.

Fourth carriage 8(4) installed on the side of first board transport mechanism 5A of component mounter M1 holds tape feeder 9 for supplying specific component Dp of specific group Gp2. In addition, third carriage 8(3) installed on the side of second board transport mechanism 5B of component mounter M1 holds tape feeder 9 for supplying specific component Dp of specific group Gp1.

In this state, board 6 (first board 6A) of the production board type (for example, production board type B009) of specific group Gp2 is transported into first board transport mechanism 5A of component mounter M1, and the components are mounted while being transported in order of component mounter M1, component mounter M2, and component mounter M3. Similarly, board 6 (second board 6B) of the production board type (for example, production board type B001) of specific group Gp1 is transported into second board transport mechanism 5B of component mounter M1, and the components are mounted while being transported in order of component mounter M1, component mounter M2, and component mounter M3.

Next, change of the production board type that replaces fourth carriage 8(4) with carriage 8(X) for replacement from the state of component mounting system 1 of FIG. 7A will be described with reference to FIG. 7B. In changing the production board type, first, fourth carriage 8(4) is pulled out from fourth carriage installation unit 7A2 of component mounter M1. Next, carriage 8(X) for replacement in which tape feeder 9 and component reel 10 are previously set is attached to fourth carriage installation unit 7A2. While replacing this carriage 8, on the side of second board transport mechanism 5B, the production of production board type B001 can be continued.

That is, in component mounting system 1, when changing the production board type of any one of boards 6 transported by first board transport mechanism 5A or second board transport mechanism 5B, component mounter M1 supplies the components from tape feeder 9 (component supply device) held by first carriage 8(1) installed on the side of board transport mechanism 5 (first board transport mechanism 5A) that transports board 6 (first board 6A) to be changed, and tape feeder 9 (component supply device) held by second carriage 8(2) and third carriage 8(3) installed on the side of board transport mechanism 5 (second board transport mechanism 5B) that transports board 6 (second board 6B) not to be changed, and causes first mounting mechanism 14A and second mounting mechanism 14B to mount the components on board 6 (second board 6B) which does not change the production board type.

When changing the production board type of board 6 transported by first board transport mechanism 5A or second board transport mechanism 5B, (in here, change of production board type of first board 6A), fourth carriage 8(4) is replaced with carriage 8(X) for replacement in which specific component Dp mounted on changed board 6 (third board 6C) is set.

In FIG. 7B, when carriage 8(X) for replacement is attached, board 6 (third board 6C) of the production board type (for example, production board type BXX1) of specific group GpX is transported into first board transport mechanism 5A of component mounter M1, and production of production board type BXX1 is started. In this manner, in the component mounting system 1, since it is possible to switch the production board type by replacing fourth carriage 8(4) with carriage 8(X) for replacement that is previously set, the decrease in the device operation rate due to the device shutdown at the time of replacement of the feeder can be reduced, while suppressing the decrease in the number of placements of tape feeder 9 (component feeder).

In the example of component mounting system 1 of FIGS. 7A and 7B, similarly to component mounter M1 which mounts common component Dc and specific component Dp, component mounter M2 and component mounter M3 which mount only common component Dc are configured so that two carriages 8 can be respectively installed on the side of first board transport mechanism 5A and on the side of second board transport mechanism 5B, but the invention is not limited to this configuration. For example, component mounter M2 and component mounter M3 may be configured so that only one carriage 8 can be installed on the side of first board transport mechanism 5A and on the side of second board transport mechanism 5B.

That is, component mounting system 1 may have at least one component mounter M1 provided with first board transport mechanism 5A, second board transport mechanism 5B, first mounting mechanism 14A, second mounting mechanism 14B, a plurality of carriages (two in the example) installed on the side of first board transport mechanism 5A, and a plurality of carriages (two in the example) installed on the side of second board transport mechanism 5B.

In addition, in the example of component mounting system 1 of FIGS. 7A and 7B, component mounter M1 for mounting specific component Dp is placed on the most upstream side, but the placement of component mounters M1 to M3 is not limited to this order. For example, even the order of component mounter M2, component mounter M1, and component mounter M3 that place component mounter M1 in the middle, and even the order of component mounter M2, component mounter M3, and component mounter M1 that place component mounter M1 on the most downstream side may be placed. In addition, component mounting system 1 may connect four or more component mounters M1 to M3, and may configured to include one or two component mounters M1 to M3.

Figure 8:
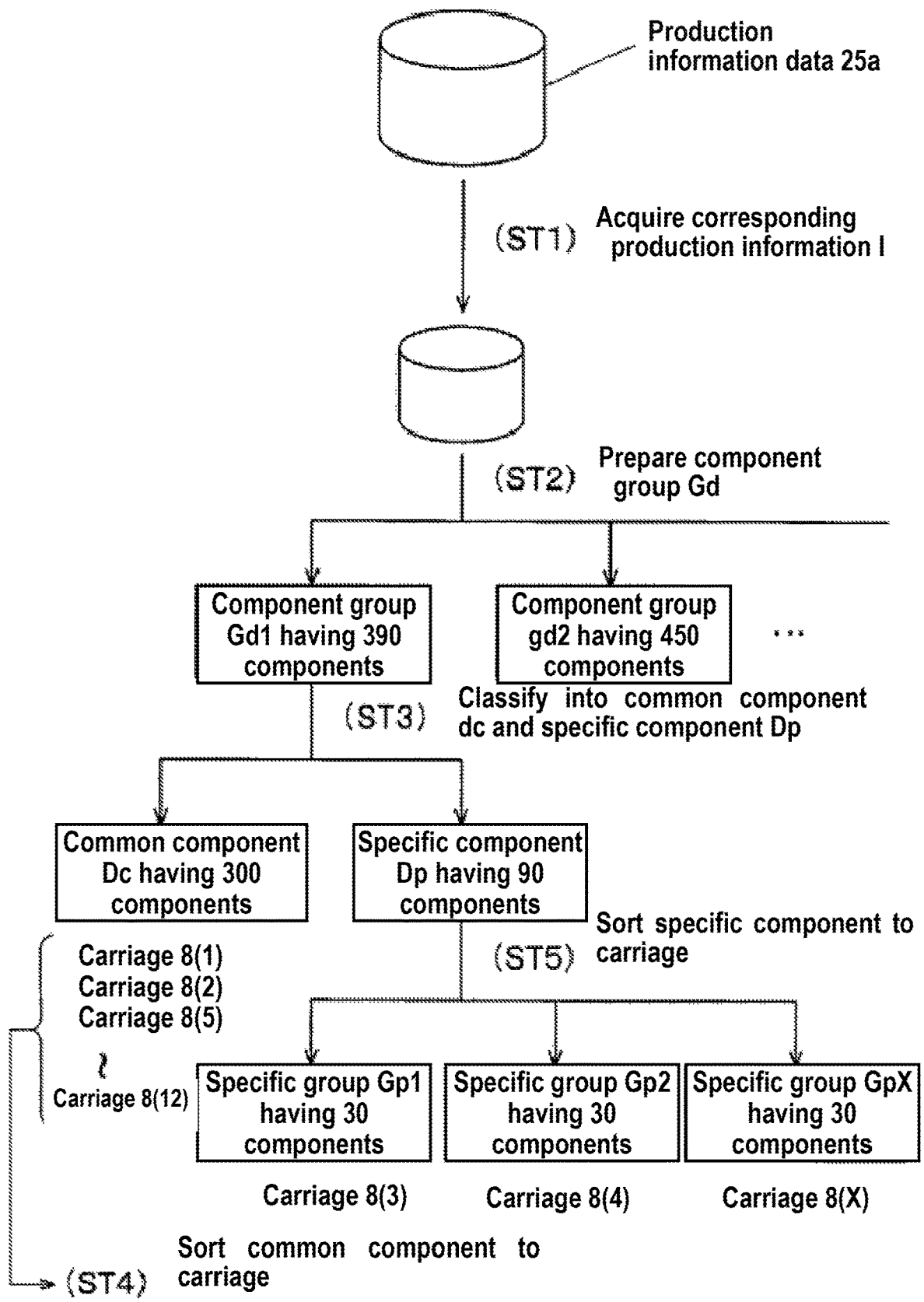
FIG. 8 is a process explanatory diagram of a component sorting method in the component mounting system according to the exemplary embodiment of the invention.

Next, a component sorting method that sorts the components to carriage 8 in component mounting system 1 will be described with reference to FIG. 8. The component board types produced by component mounting system 1 are the same as the example of FIGS. 6A to 6C described above. In addition, a configuration of component mounters M1 to M3 is the same as the example of FIGS. 7A to 7B described above. In FIG. 8, first, acquisition unit 24a of computer 3 extracts and acquires production information I of the board to be produced in component mounting system 1, from production information data 25a stored in management storage unit 25 (ST1). That is, at least one piece of production information I including the component information mounted of the component on board 6 (first board 6A) transported by first board transport mechanism 5A, and at least one piece of production information I including the component information of the component mounted on board 6 (second board 6B) transported by second board transport mechanism 5B are acquired.

Next, component group preparing unit 24b prepares at least one component group Gd, based on commonality P of the component (refer to FIG. 6A) included in the acquired plurality pieces of production information I (ST2). In here, component group Gd1 having 390 components and a component group Gd2 having 450 components are generated (refer to also FIG. 6B). Next, component sorting unit 24c classifies component group Gd into common component Dc and specific component Dp (ST3). In here, component group Gd1 is classified into common component Dc having 300 components and specific component Dp having 90 components (refer to also FIG. 6C).

In FIG. 8, next, component sorting unit 24c sorts common component Dc to first carriage 8(1) and second carriage 8(2) installed on component mounter M1, carriages 8(5) to 8(8) installed on component mounter M2, and carriages 8(9) to 8(12) installed on component mounter M3 (ST4) (refer to also FIG. 7A). Next, component sorting unit 24c sorts specific component Dp to three specific groups Gp (refer to also FIG. 7A). Component sorting unit 24c respectively sorts 30 components of specific component Dp of specific group Gp1 to third carriage 8(3), 30 components of specific group Gp2 to fourth carriage 8(4), and 30 components of specific group GpX to carriage 8(X) for replacement (ST5).

That is, in ST3 to ST5, among prepared component groups Gd, component sorting unit 24c sorts common component Dc mounted on both board 6 (first board 6A) transported by first board transport mechanism 5A and board 6 (second board 6B) transported by second board transport mechanism 5B, to first carriage 8(1) installed on the side of first board transport mechanism 5A and second carriage 8(2) installed on the side of second board transport mechanism 5B, sorts specific component Dp mounted only on board 6 (second board 6B) transported by second board transport mechanism 5B to the other third carriage 8(3) installed on the side of second board transport mechanism 5B, and sorts specific component Dp mounted only on board 6 (first board 6A) transported by first board transport mechanism 5A to the other fourth carriage 8(4) installed on the side of first board transport mechanism 5A.

In this manner, the decrease in the device operation rate due to the device shutdown at the time of replacement of the feeder can be reduced, while suppressing the decrease in the number of placements of tape feeder 9 (component feeder).

The component mounting system, the component sorting method, and the component mounter of the invention have an effect that the decrease in the device operation rate due to the device shutdown at the time of replacement of the feeder can be reduced, while suppressing the decrease in the number of placements of the components feeders, and are useful in the component mounting field where components are mounted on the board.

What is claimed is:

1. A component mounting system comprising:
   a plurality of component mounters, each component mounter including:
   a first board transport mechanism that transports, positions, and holds a board,
   a second board transport mechanism that transports, positions, and holds a board,
   a first mounting head that is disposed on a side of the first board transport mechanism and mounts components on the board,
   a second mounting head that is disposed on a side of the second board transport mechanism and mounts the components on the board,
   a plurality of carriages that are installed on the side of the first board transport mechanism, wherein installed on each carriage are a first plurality of component supply devices which supply the components, and
   a plurality of carriages that are installed on the side of the second board transport mechanism, wherein installed on each carriage are a second plurality of component supply devices,
   wherein when changing a production board type of any one of the boards transported by the first board transport mechanism and the second board transport mechanism, the components are supplied from the plurality of component supply devices held by a first carriage installed on the side of one of the board transport mechanisms that transports the board to be changed, and the plurality of component supply devices held by a second carriage and a third carriage installed on the side of another of the board transport mechanisms that transports the board not to be changed, and the components are mounted on the board that does not change the production board type by the first mounting head and the second mounting head.

2. The component mounting system of claim 1, further comprising:
   an acquisition unit that acquires at least one piece of production information including component information of the components to be mounted on the board transported by the first board transport mechanism, and at least one piece of production information including component information of the components to be mounted on the board transported by the second board transport mechanism;
   a component group preparing unit that prepares at least one component group, based on commonalities of the components included in an acquired plurality pieces of production information; and
   a component sorting unit that sorts common components to be mounted on both of the board transported by the first board transport mechanism and the board transported by the second board transport mechanism among the prepared component groups, to the first carriage and the second carriage, sorts specific components to be mounted only on the board transported by the board transport mechanism on the side on which the second carriage is installed, to the third carriage, and sorts specific components to be mounted only on the board transported by the board transport mechanism on the side on which the first carriage is installed, to another fourth carriage on the side on which the first carriage is installed.

3. The component mounting system of claim 2,
wherein when changing the production board type of any one of the boards transported by the first board transport mechanism and the second board transport mechanism, the another fourth carriage is replaced.

4. A component mounter comprising:
a first board transport mechanism that transports, positions, and holds a board;
a second board transport mechanism that transports, positions, and holds a board along the first board transport mechanism;
a first mounting head disposed on a side of the first board transport mechanism and mounts components on the board;
a second mounting head disposed on a side of the second board transport mechanism and mounts the components on the board;
a plurality of carriages that are installed on the side of the first board transport mechanism, wherein installed on each carriage are a first plurality of component supply devices which supplies the components; and
a plurality of carriages that are installed on the side of the second board transport mechanism, wherein installed on each carriage are a second plurality of component supply devices,
wherein when changing a production board type of any one of the boards transported by the first board transport mechanism and the second board transport mechanism, the components are supplied from the plurality of component supply devices held by a first carriage installed on the side of one of the board transport mechanisms that transports the board to be changed, and the plurality of component supply devices held by a second carriage and a third carriage installed on the side of another of the board transport mechanisms that transports the board not to be changed, and the components are mounted on the board that does not change the production board type by the first mounting head and the second mounting head.

5. The component mounter of claim 4,
wherein when changing a production board type of any one of the boards transported by the first board transport mechanism and the second board transport mechanism, even while a fourth carriage installed on the side of one of the board transport mechanisms that transports the board to be changed is replaced, mounting of the components on the board that does not change the production board type is continued.

* * * * *